United States Patent
Nagai

(10) Patent No.: US 8,618,591 B2
(45) Date of Patent: Dec. 31, 2013

(54) SEMICONDUCTOR DEVICE COMPRISING PILLAR ARRAY AND CONTACT ARRAY

(75) Inventor: Yukihiro Nagai, Taichung (TW)

(73) Assignee: Rexchip Electronics Corporation, Taichung (TW)

( * ) Notice: Subject to any disclaimer, the term of this patent is extended or adjusted under 35 U.S.C. 154(b) by 0 days.

(21) Appl. No.: 13/455,371

(22) Filed: Apr. 25, 2012

(65) Prior Publication Data

US 2013/0285199 A1   Oct. 31, 2013

(51) Int. Cl.
 *H01L 27/108* (2006.01)
 *H01L 29/94* (2006.01)

(52) U.S. Cl.
 USPC .......................................... 257/296; 257/390

(58) Field of Classification Search
 USPC ................................. 257/296, 390
 See application file for complete search history.

(56) References Cited

U.S. PATENT DOCUMENTS

| | | | | |
|---|---|---|---|---|
| 5,629,539 A | * | 5/1997 | Aoki et al. | 257/306 |
| 6,097,621 A | * | 8/2000 | Mori | 365/63 |
| 6,459,119 B1 | * | 10/2002 | Huang et al. | 257/314 |
| 6,734,056 B2 | * | 5/2004 | Mandelman et al. | 438/212 |
| 2002/0171146 A1 | * | 11/2002 | Iyer et al. | 257/750 |
| 2005/0161721 A1 | * | 7/2005 | Iyer et al. | 257/296 |

* cited by examiner

*Primary Examiner* — Ngan Ngo

(74) *Attorney, Agent, or Firm* — Trop, Pruner & Hu, P.C.

(57) ABSTRACT

A semiconductor device includes: a substrate having a base and a pillar array including a plurality of pillars; a plurality of bit lines, each of which is disposed between two adjacent ones of the columns of the pillar array; a plurality of word lines, each of which is connected to a corresponding one of the rows of the pillar array; and a contact array including a plurality of bit line contacts arranged in rows and columns. The bit line contacts of each column of the contact array are embedded in the base and are electrically connected to a respective one of the bit lines. Each bit line contact intersects the respective one of the bit lines and extends between and is electrically connected to two adjacent ones of the pillars.

7 Claims, 20 Drawing Sheets

US 8,618,591 B2

SEMICONDUCTOR DEVICE COMPRISING PILLAR ARRAY AND CONTACT ARRAY

BACKGROUND OF THE INVENTION

1. Field of the Invention

This invention relates to a semiconductor device and a method for making the same, more particularly to a semiconductor device having an array of pillars and metallic bit lines each of which is connected to a column of slanted bit line contacts extending in a direction slanted relative to a column direction and a row direction of the pillar array.

2. Description of the Related Art

Dynamic random access memory (DRAM) device is a volatile memory device for storing data or information, and includes an array of transistors and capacitors, bit lines electrically coupled to sources or drains of the transistors, and word lines electrically coupled to gates of the transistors. Development of the DRAM devices in the DRAM industry has been focused on how to minimize DRAM chip size. One way of minimizing DRAM chip size is accomplished by forming deep trenches in a Si substrate. The smaller the width of the trenches, the smaller the DRAM chip size will be. However, to reduce the width of the trenches from the current DRAM generation (the width of the trench is about 60 nm) to the next DRAM generation (the width of the trench is about 20-40 nm) can be a great challenge.

FIGS. 1A and 1B illustrate a conventional $4F^2$ vertical cell type DRAM device that includes: a substrate 1 having a base 11 and a pillar array of pillars 12 extending upwardly from the base 11; a plurality of buried bit lines 13, each of which is embedded in the base 11 and is disposed below and connected to the pillars 12 of a respective one of the columns of the pillar array; a plurality of word lines 14, each of which is connected to middle portions of the pillars 12 of a respective one of rows of the pillar array; an insulator material (not shown) filling gaps among the pillars 12, the buried bit lines 13, and the word lines 14; and a plurality of capacitors 15 disposed on and electrically connected to the pillars 12, respectively.

FIGS. 1C to 1H illustrate consecutive steps of a conventional method of forming the $4F^2$ DRAM device. The method includes: forming bit line trenches 10 in a semiconductor substrate 1 so as to form the substrate 1 into a base 11 and elongate bars 121 extending upwardly from the base 11 (see FIG. 1C); forming a liner layer 131 on two opposing bar walls of each of the bit line trenches 10 (see FIG. 1D); ion implanting a N+ dopant (such as P, As, or N type ions) into the base 11 at a bottom of each of the bit line trenches 10, followed by annealing or thermal diffusion so as to form a doped region 133 thereat (see FIG. 1E); deepening each of the bit line trenches 10 by dry etching in order to cut each doped region 133 into two separate halves 133a and 133b, thereby forming separated buried bit lines 13 (see FIG. 1F); filling the bit line trenches 10 with a gap fill material 151 (see FIG. 1G); forming a plurality of word line trenches 16, each of which is disposed above and extends across the buried bit lines 13 so as to form each of the elongate bars 121 into a column of pillars 12 (see FIG. 1H), the pillars 12 formed from the elongate bars 121 cooperatively forming a pillar array and being arranged in rows and columns; forming a gate oxide layer (not shown) on sides of each of the pillars 12; forming a plurality of word lines 14, each of which is formed on the gate oxide layer on the sides of the pillars 12 of a respective one of the rows of the pillar array; filling the word line trenches 16 with an insulator material (not shown); and forming a plurality of capacitors (not shown) that are respectively disposed on and electrically connected to the pillars 12.

The conventional method is disadvantageous in that since the doped region 133 thus formed is relatively thick in the depth direction, the bit line trench 10 is required to be deepened an extra depth (e.g., about 200 nm) that is sufficient to cut through the doped region 133, which is very difficult to perform for a narrow space in the trench 10, and that since each buried bit line 13 is made from the dopant which has a relatively low conductivity, the same has a high resistance, which can cause an adverse effect on miniaturization of the DRAM device and hinder the integration of high density of memory cells into each buried bit line 13. In addition, it is relatively difficult to form pick-up contacts or deep position metal silicidate contacts on the buried bit lines 13 in order to reduce the resistance of each buried bit line 13.

SUMMARY OF THE INVENTION

Therefore, an object of the present invention is to provide a semiconductor device and a method for making the same that can overcome the aforesaid drawbacks associated with the prior art.

According to one aspect of the present invention, there is provided a semiconductor device that comprises: a substrate having a base and a pillar array, the pillar array including a plurality of pillars extending upwardly from the base and arranged in rows and columns, the pillars of each of the columns of the pillar array being disposed along a column direction; a plurality of bit lines, each of which extends in the column direction and each of which is disposed between two adjacent ones of the columns of the pillar array; a plurality of word lines, each of which extends in a row direction transverse to the column direction and each of which is electrically connected to a corresponding one of the rows of the pillar array; and a contact array including a plurality of bit line contacts arranged in rows and columns. The bit line contacts of each of the columns of the contact array is disposed along the column direction, is embedded in the base and is electrically connected to a respective one of the bit lines. Each of the bit line contacts of each of the columns of the contact array intersects the respective one of the bit lines and extends between and is electrically connected to two adjacent ones of the pillars.

According to another aspect of the present invention, there is provided a method for making a semiconductor device. The method comprises: (a) forming a plurality of twisted first grooves and a plurality of parallel second grooves in a substrate such that the second grooves intersect the first grooves so as to form the substrate into a lower support and a post array, the post array having a plurality of posts that extend upwardly from the lower support and that are arranged in rows and columns, the posts of each of the columns of the post array being aligned along a column direction in a twisted manner; (b) filling the first and second grooves in the substrate with an isolation material; (c) forming a plurality of bit line trenches, each of which extends in the column direction through the posts of a corresponding one of the columns of the post array such that each of the posts is formed into a base part and a pair of pillars which extend upwardly from the base part and which are separated by a corresponding one of the bit line trenches, the pillars formed from the posts cooperatively forming a pillar array and being arranged in rows and columns; (d) forming a contact array including a plurality of bit line contacts that are arranged in rows and columns, each of the bit line contacts of each of the columns of the contact array being embedded in a respective one of the base parts formed from the posts, and extending between and being electrically connected to two adjacent ones of the pillars that extend upwardly from the respective one of the base parts; (e) forming a plurality of bit lines, each of which is disposed in and extends along a respective one of the bit line trenches and each of which is electrically connected to a respective one of the columns of the contact array; and (f) forming a plurality of word lines, each of which extends along a row direction transverse to the column direction and each of which is electrically connected to a respective one of the rows of the pillar array.

BRIEF DESCRIPTION OF THE DRAWINGS

In drawings which illustrate embodiments of the invention.

DETAILED DESCRIPTION OF THE PREFERRED EMBODIMENTS

Figure 1A:
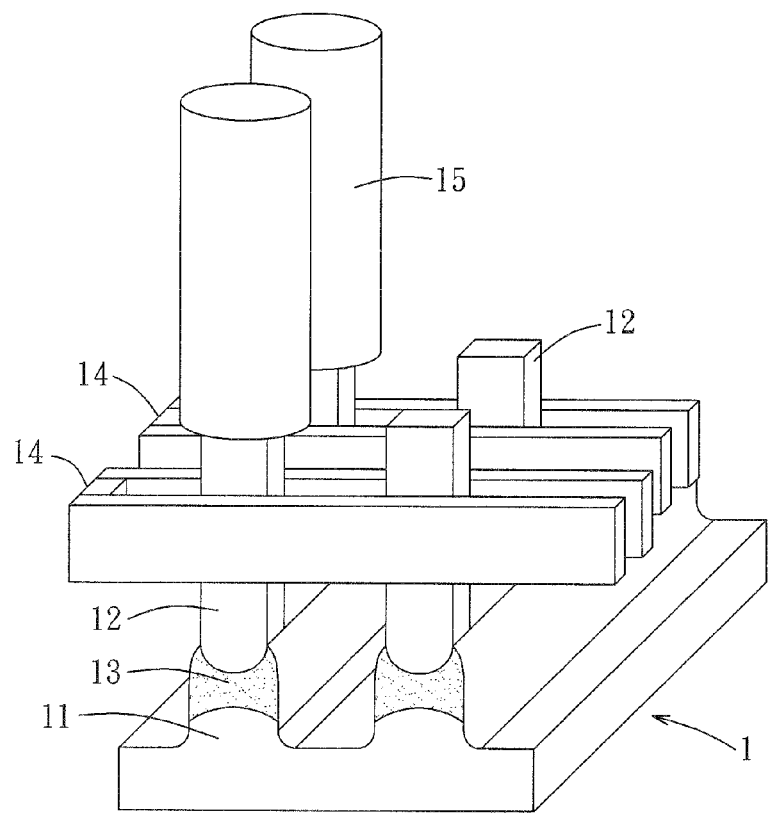
FIG. 1A is a perspective view of a conventional semiconductor device.
Figure 1B:
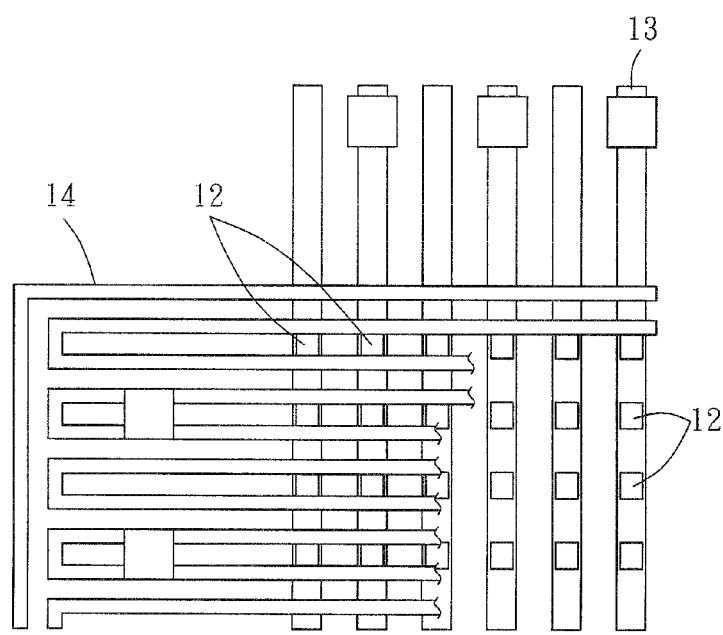
FIG. 1B is a schematic top view of the conventional semiconductor device of FIG. 1.
Figure 1E:
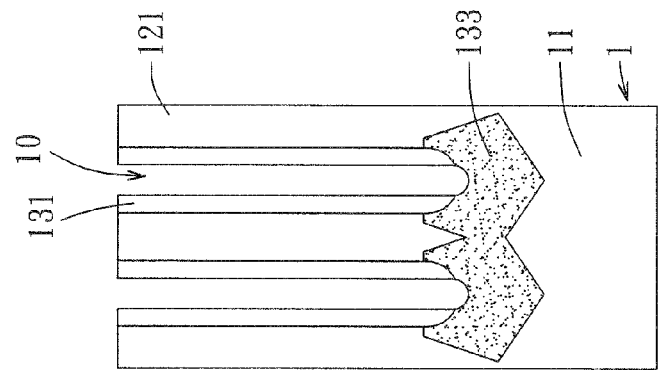
FIGS. 1C to 1H are schematic views illustrating consecutive steps of a conventional method of making the semiconductor device of FIG. 1.
Figure 1D:
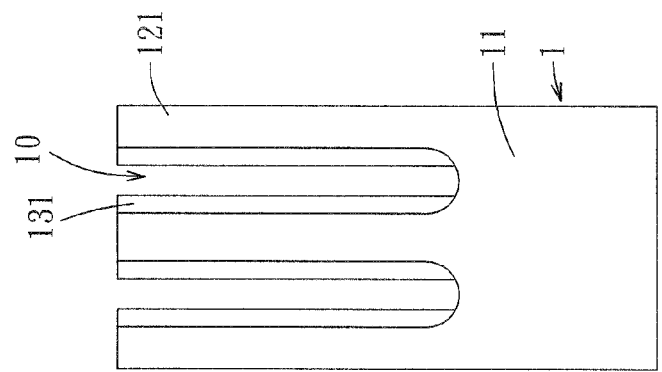
Figure 1C:
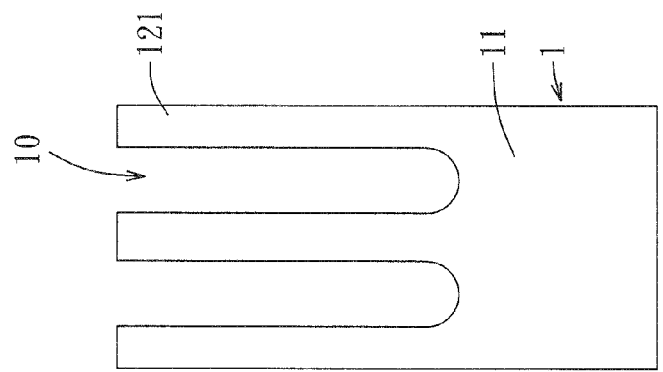
Figure 1H:
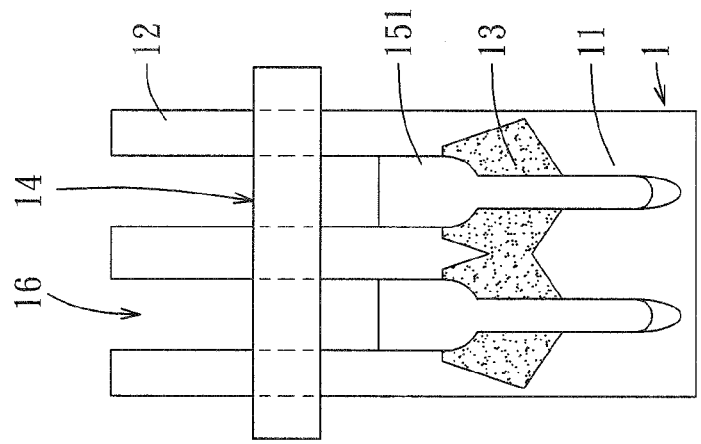
Figure 1G:
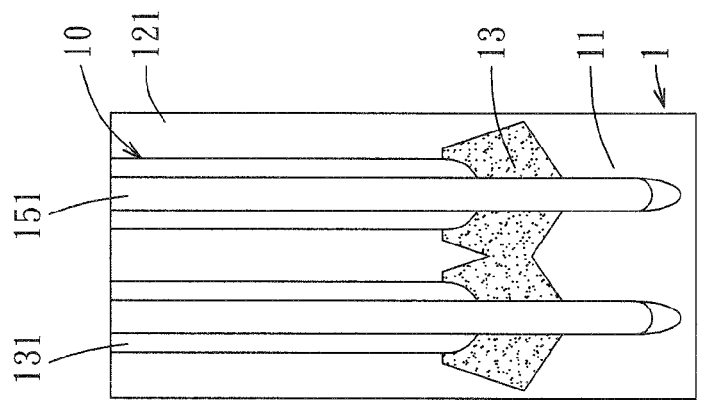
Figure 1F:
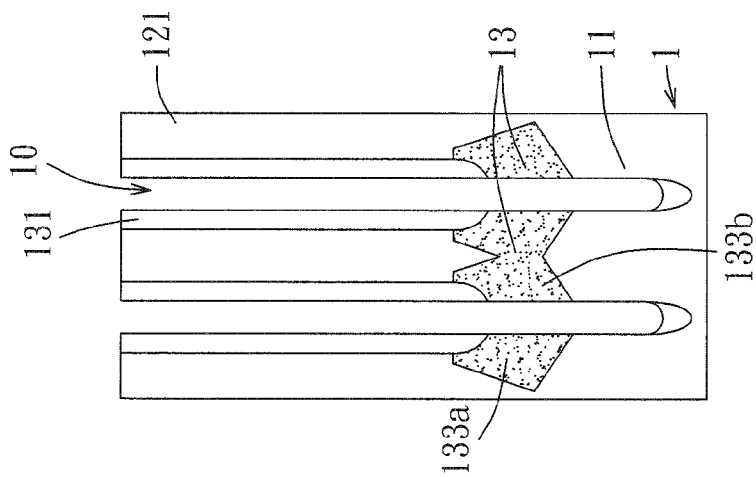

Before the present invention is described in greater detail with reference to the accompanying preferred embodiments, it should be noted herein that like elements are denoted by the same reference numerals throughout the disclosure.

Figure 2:
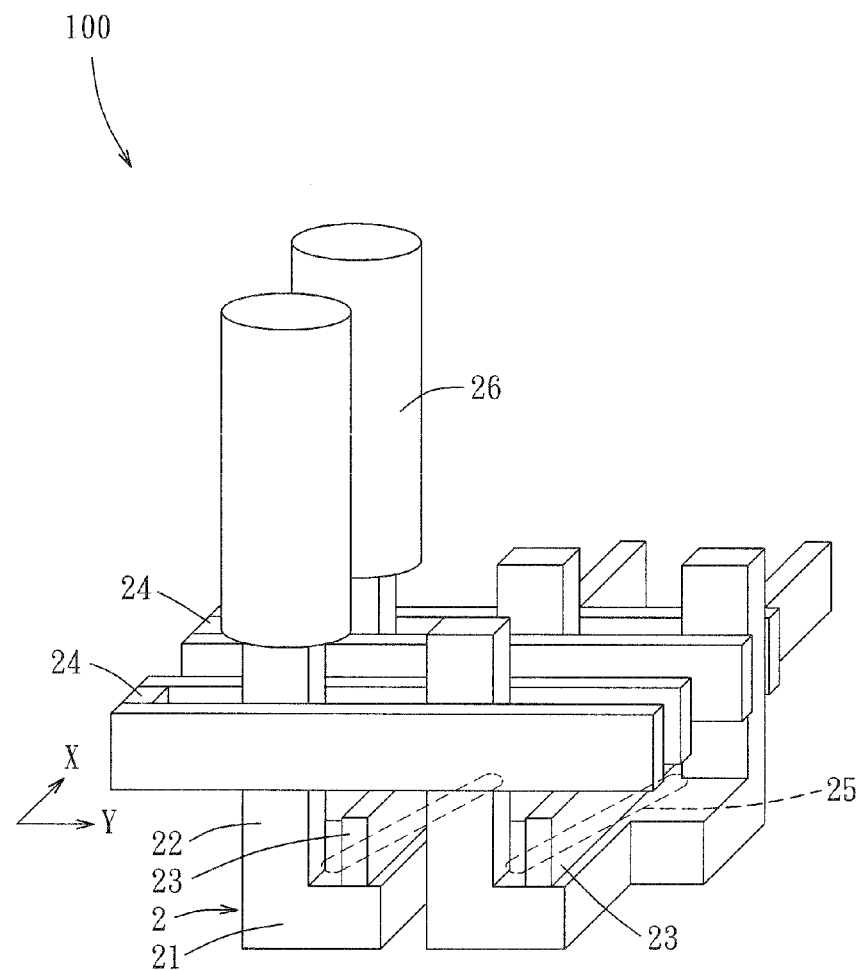
FIG. 2 is a perspective view of the first preferred embodiment of a semiconductor device according to the present invention.
Figure 3:
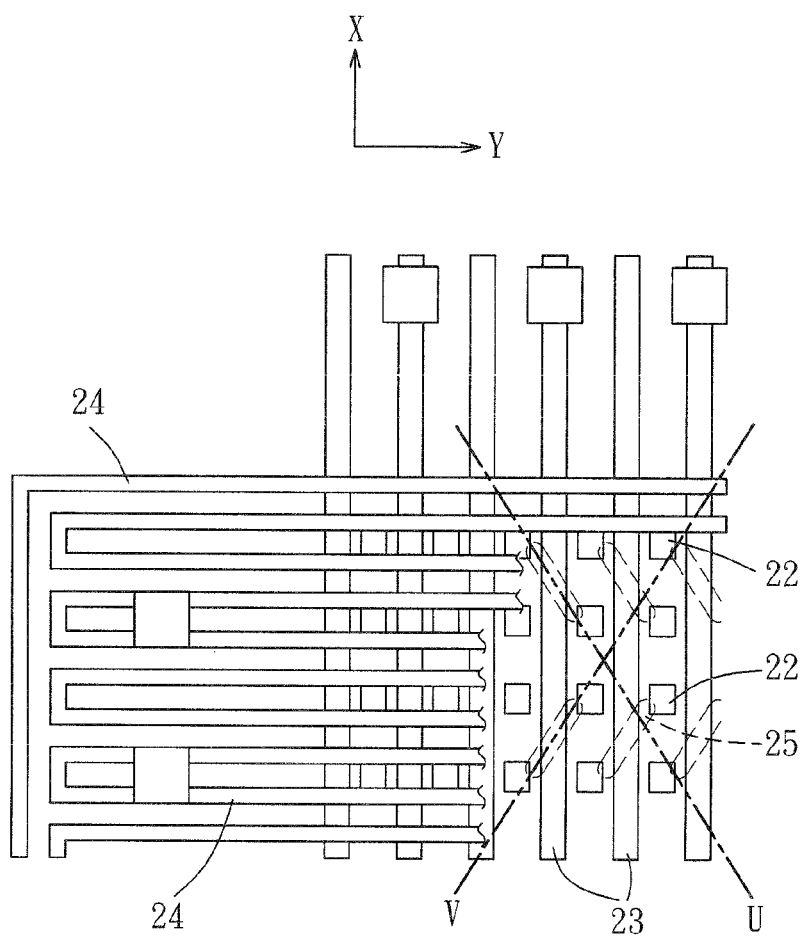
FIG. 3 is a schematic top view of the first preferred embodiment.

FIGS. 2 and 3 illustrate the first preferred embodiment of a semiconductor device 100 that can be processed to form semiconductor memory cells, such as $4F^2$ vertical cell type DRAM cells, according to the present invention.

The semiconductor device 100 includes: a substrate 2 having a base 21 and a pillar array, the pillar array including a plurality of pillars 22 extending upwardly from the base 21 and arranged in rows and columns, the pillars 22 of each of the columns of the pillar array being disposed along a column direction (X); a plurality of buried bit lines 23, each of which extends in the column direction (X) and each of which is disposed between two adjacent ones of the columns of the pillar array; a plurality of word lines 24, each of which extends in a row direction (Y) transverse to the column direction (X) and each of which is electrically connected to the pillars 22 of a corresponding one of the rows of the pillar array; a plurality of capacitors 26 respectively disposed on and electrically connected to top ends of the pillars 22; and a contact array including a plurality of bit line contacts 25 arranged in rows and columns. The bit line contacts 25 of each of the columns of the contact array are disposed along the column direction (X), are embedded in the base 21 and are electrically connected to a respective one of the bit lines 23. Each of the bit line contacts 25 of each of the columns of the contact array intersects the respective one of the bit lines 23 and extends between and is electrically connected to two adjacent ones of the pillars 22 that are diagonally disposed, i.e., the two adjacent ones of the pillars 22 are respectively located at two adjacent rows of the pillar array as well as at two adjacent columns of the pillar array, and each of the two adjacent ones of the pillars 22 is connected to the corresponding one of the word lines 24.

Each of the pillars 22 has a source region, a drain region and a conduction channel region (not shown).

An insulator (not shown) fills gaps among the pillars 22, the bit lines 23, and the word lines 24.

In this embodiment, each of the bit line contacts 25 of each of the columns of the contact array extends along a length direction (U, V) between the two adjacent ones of the pillars 22. The length direction (U) of each of the bit line contacts 25 of each of the columns of the contact array crosses the length direction (V) of an adjacent one of the bit line contacts 25 of each of the columns of the contact array.

Each of the bit lines 23 is made from a conductive material containing a refractory metal, a nitride of the refractory metal, and a silicide of the refractory metal. The refractory metal is preferably selected from titanium, tungsten, nickel and cobalt.

Each of the bit line contacts 25 contains implanted ions selected from As, P, and N type ions.

Preferably, the substrate 2 is a p-type or n-type silicon wafer.

Figure 4:
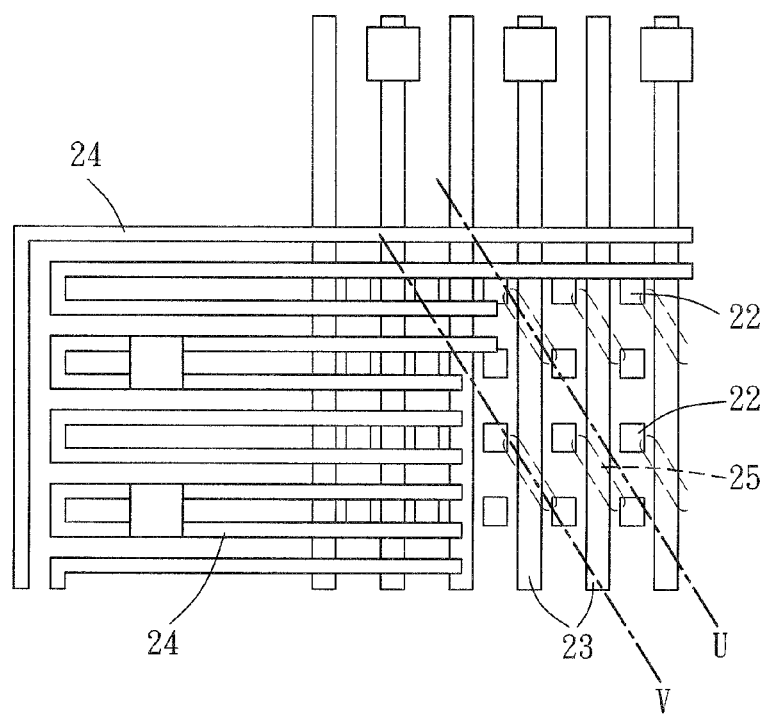
FIG. 4 is a schematic top view of the second preferred embodiment of a semiconductor device according to the present invention.

FIG. 4 illustrates the second preferred embodiment of a semiconductor device 100 according to the present invention. The second preferred embodiment differs from the previous embodiment in that the length direction (U) of each of the bit line contacts 25 of each of the columns of the contact array is parallel to the length direction (V) of an adjacent one of the bit line contacts 25 of each of the columns of the contact array.

Figure 5A:
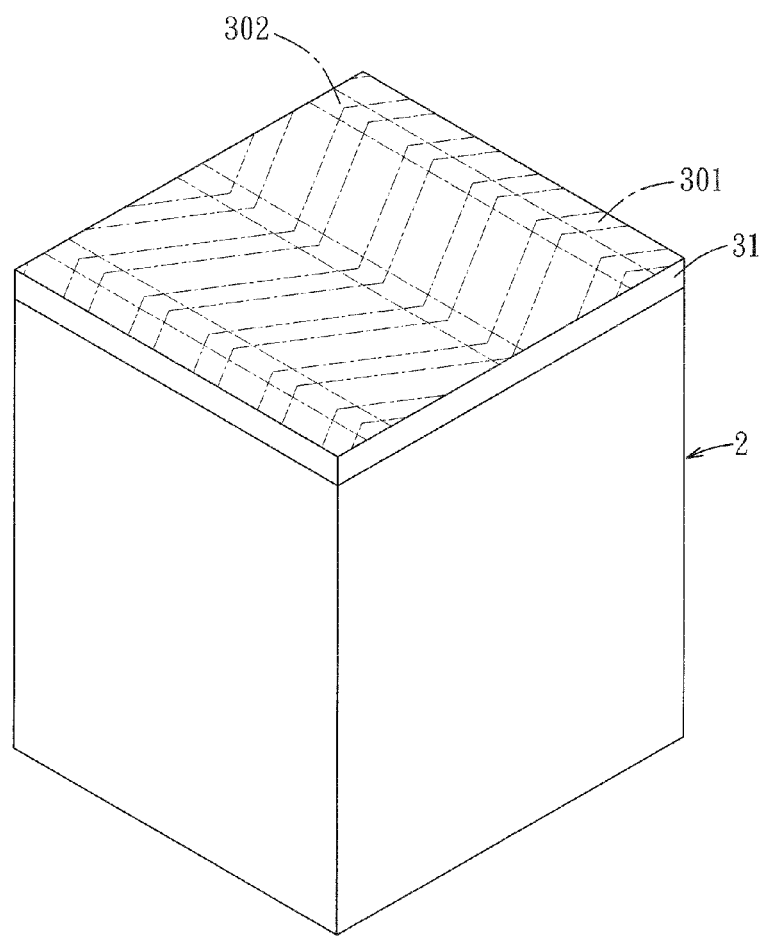
FIGS. 5A to 5W are schematic views to illustrate consecutive steps of a method of making the first preferred embodiment of the semiconductor device according to the present invention.
Figure 5B:
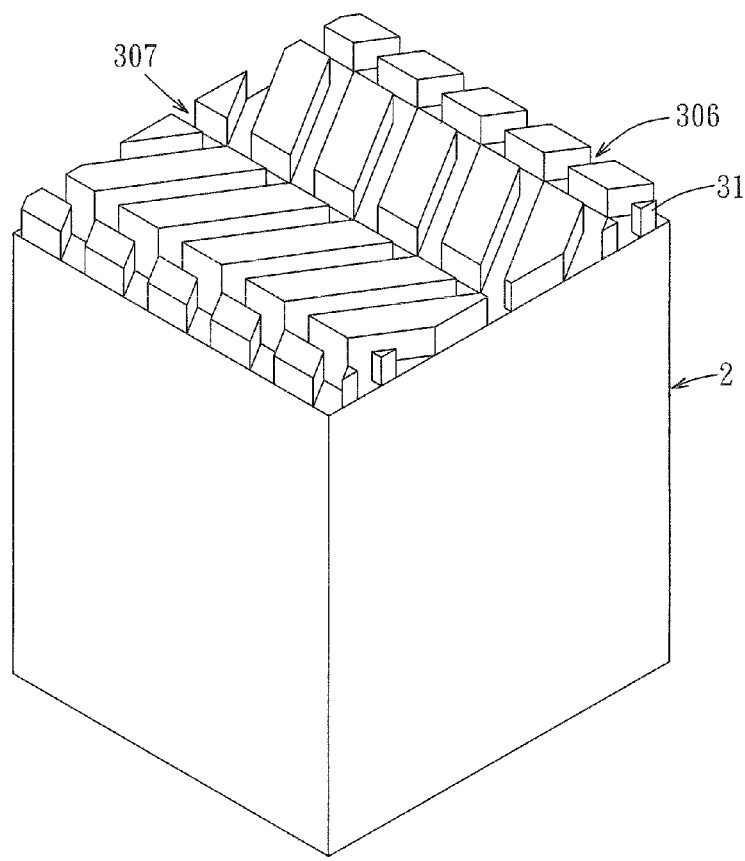
Figure 5D:
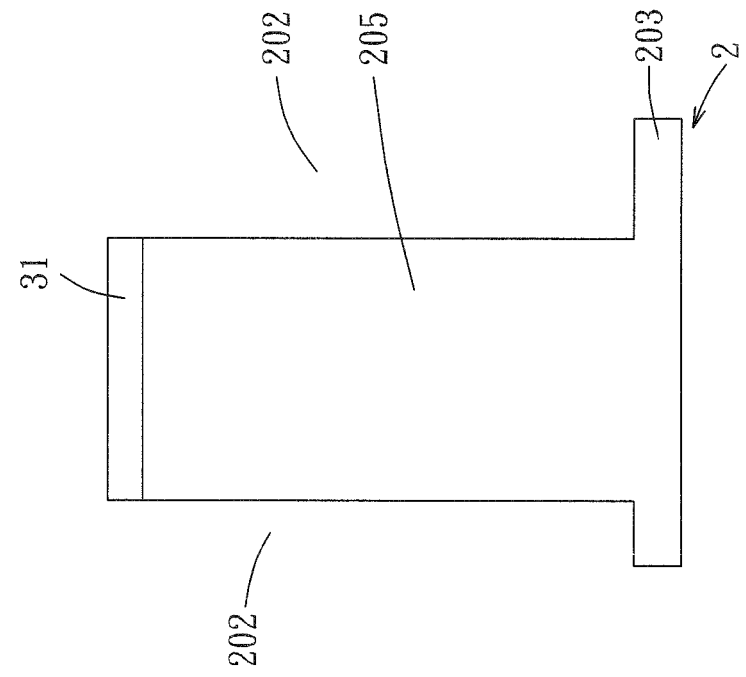
Figure 5C:
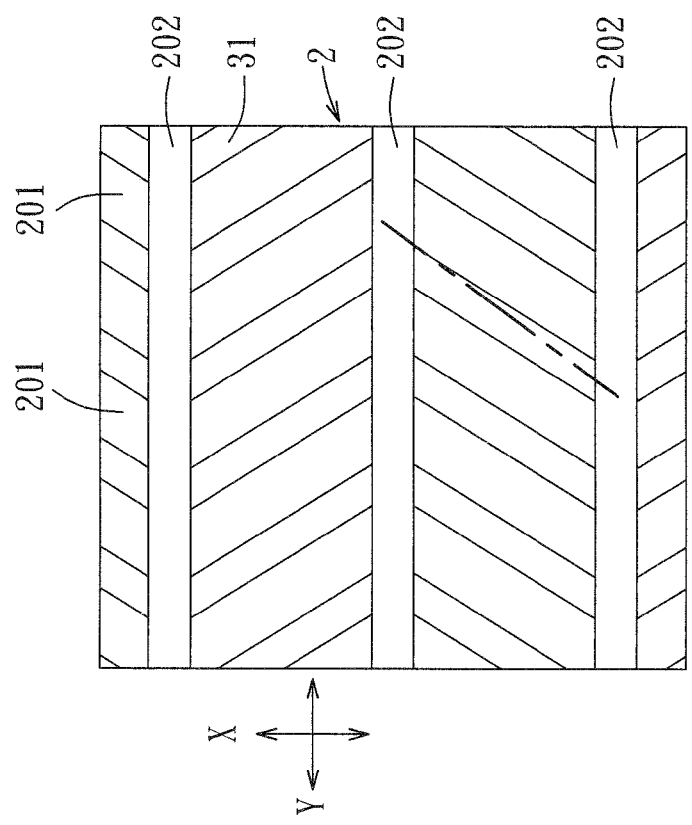
Figure 5F:
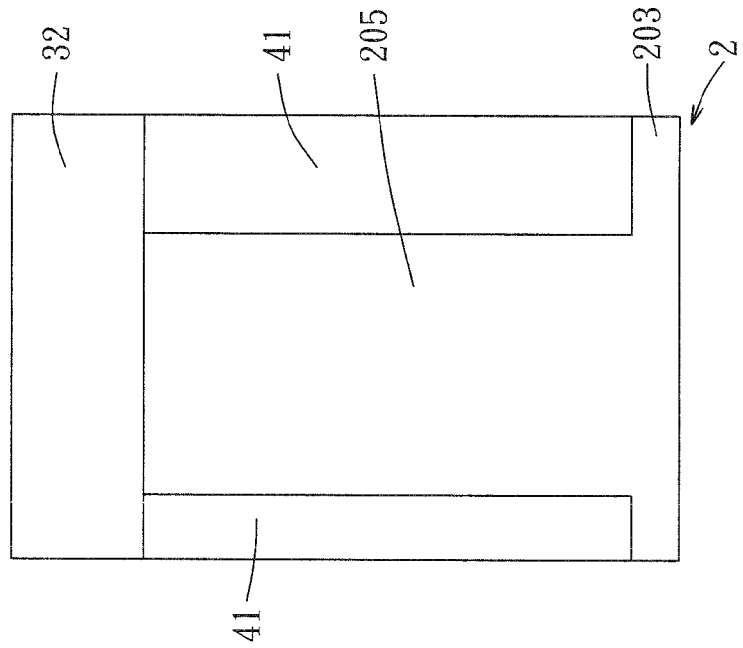
Figure 5E:
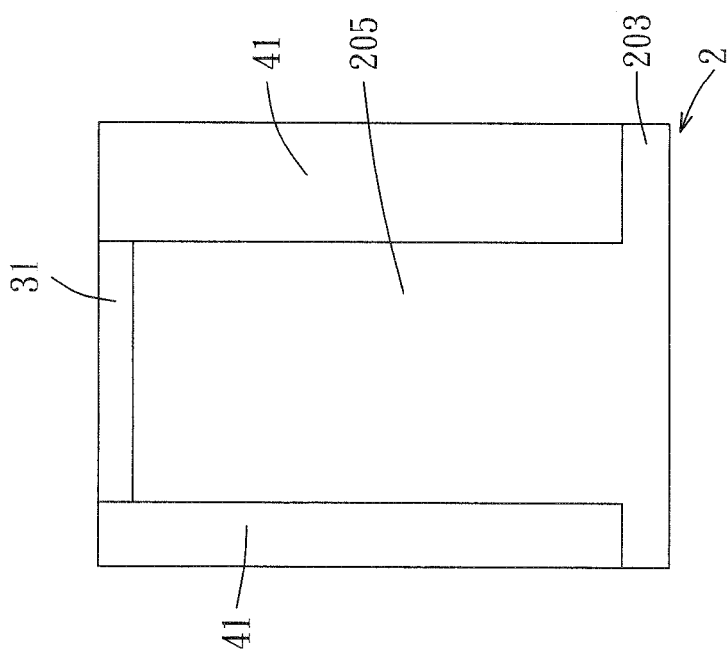
Figure 5H:
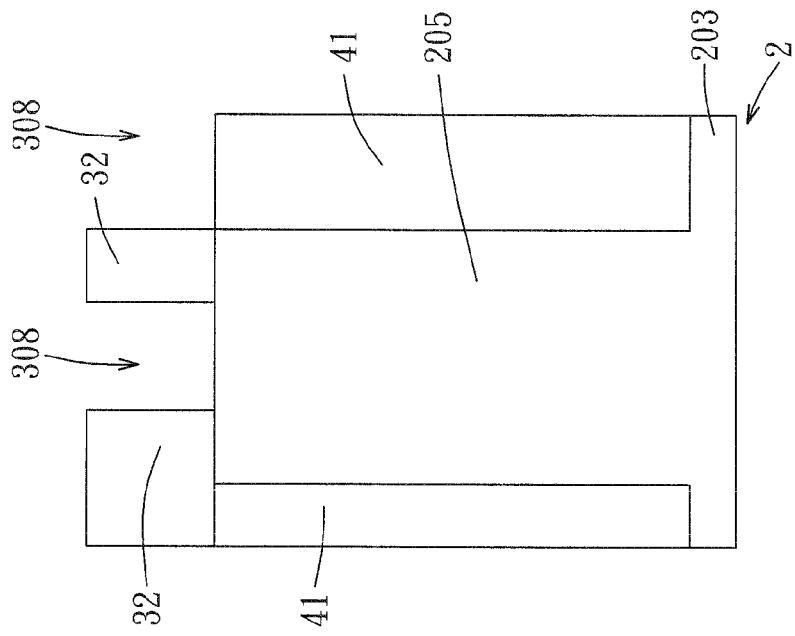
Figure 5G:
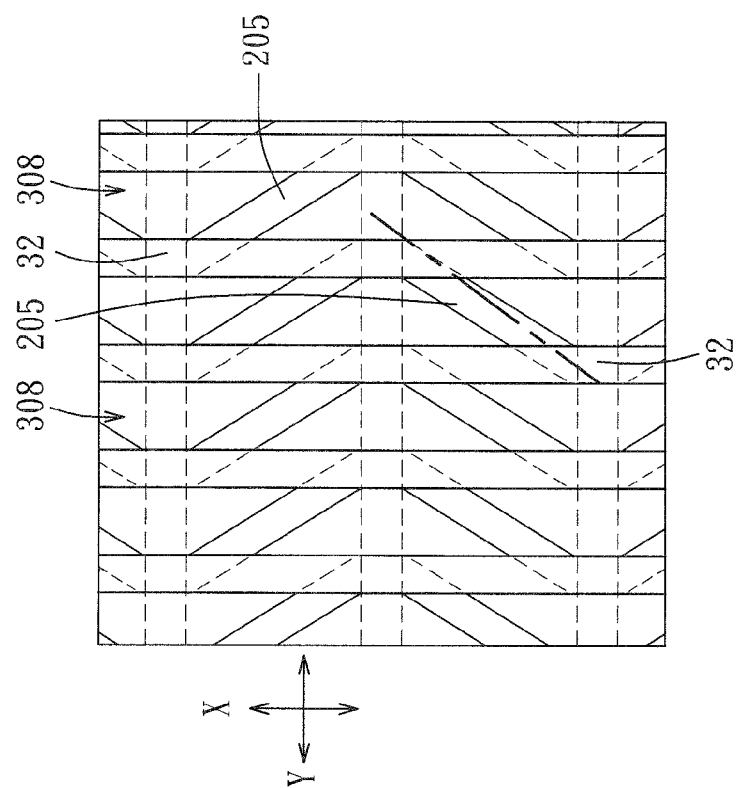
Figure 5J:
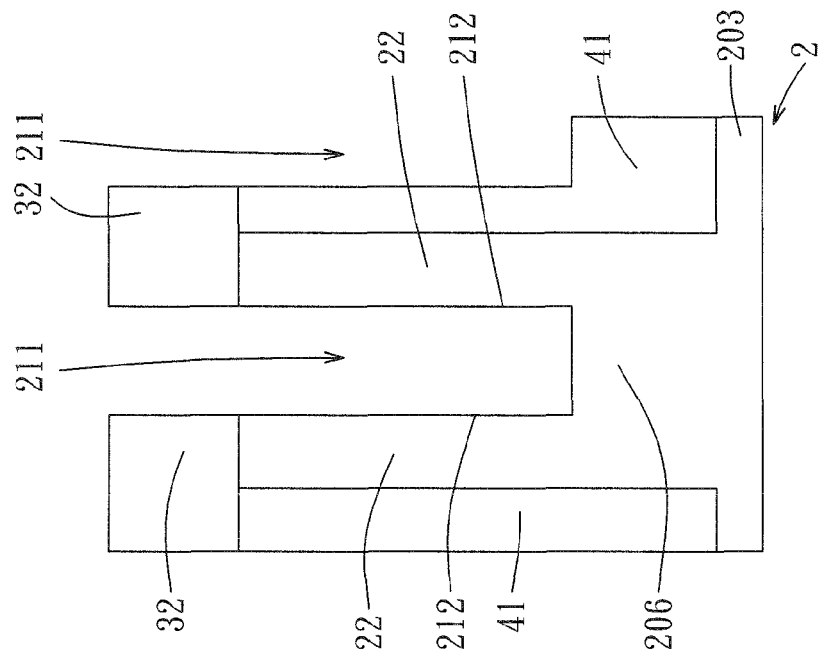
Figure 5I:
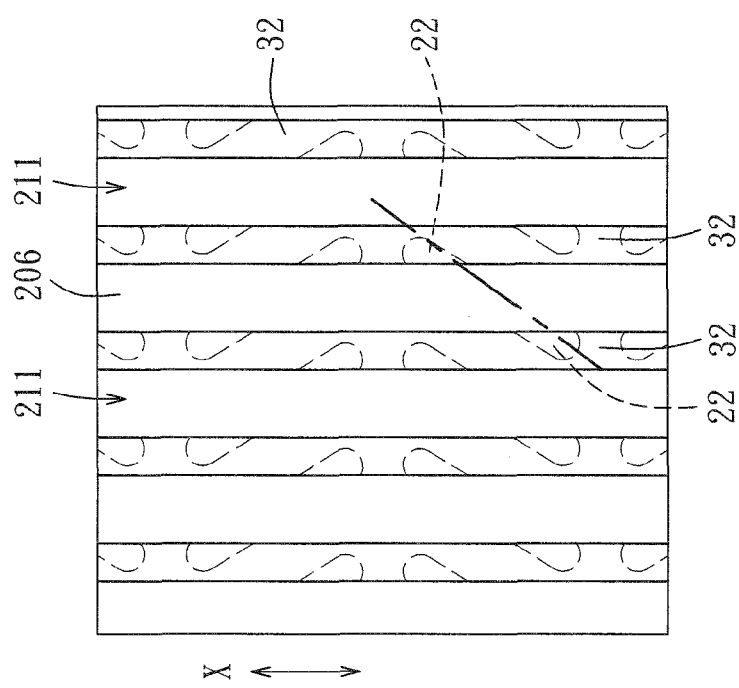
Figure 5K:
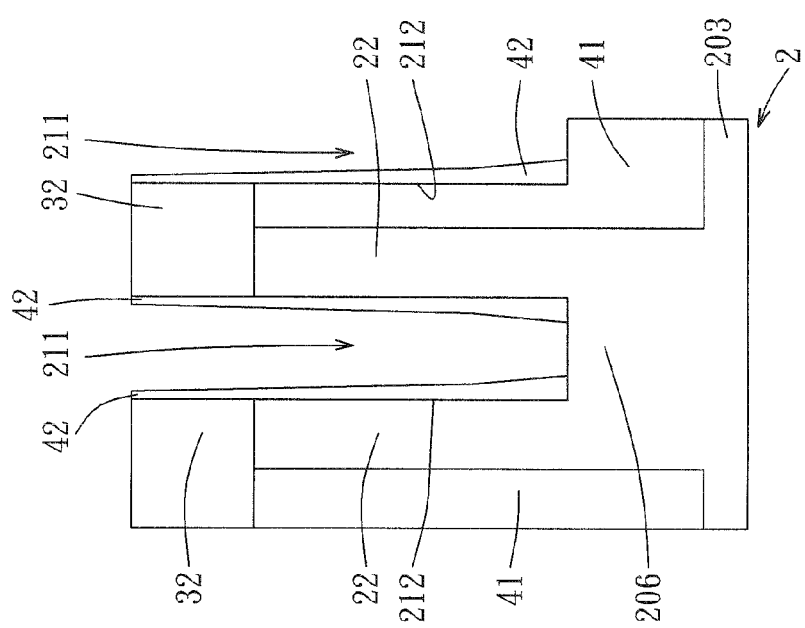
Figure 5M:
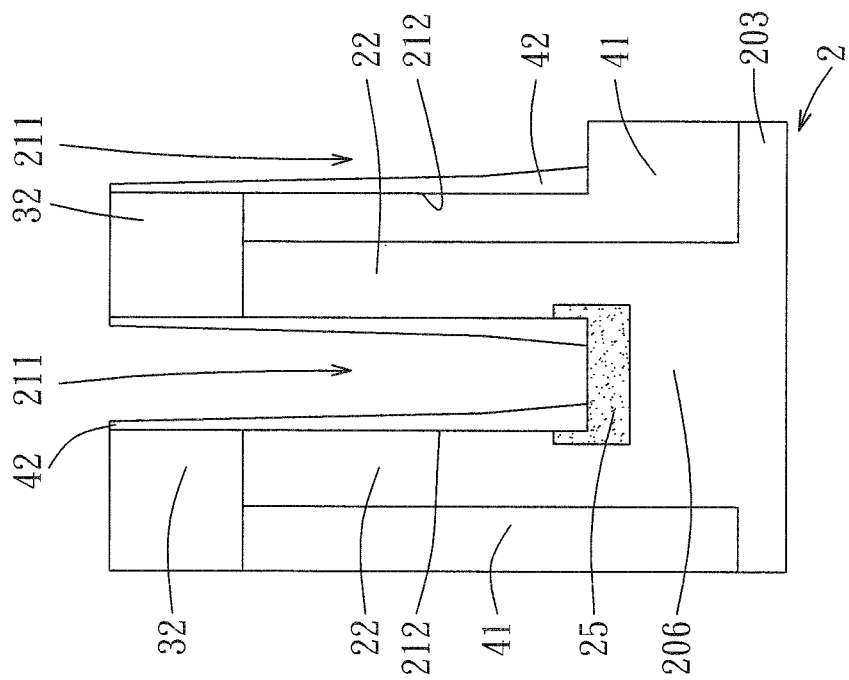
Figure 5L:
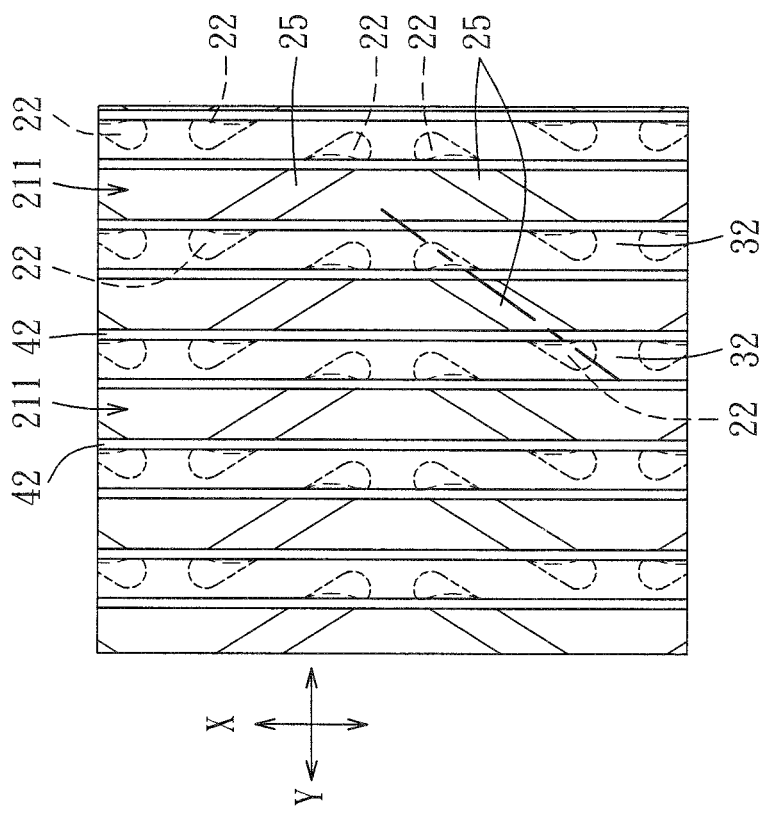
Figure 5O:
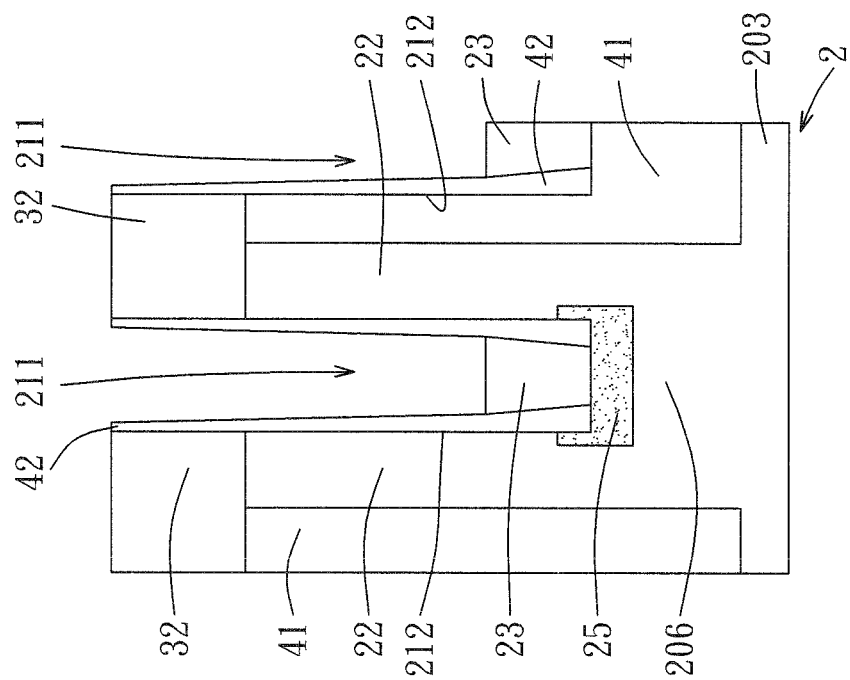
Figure 5N:
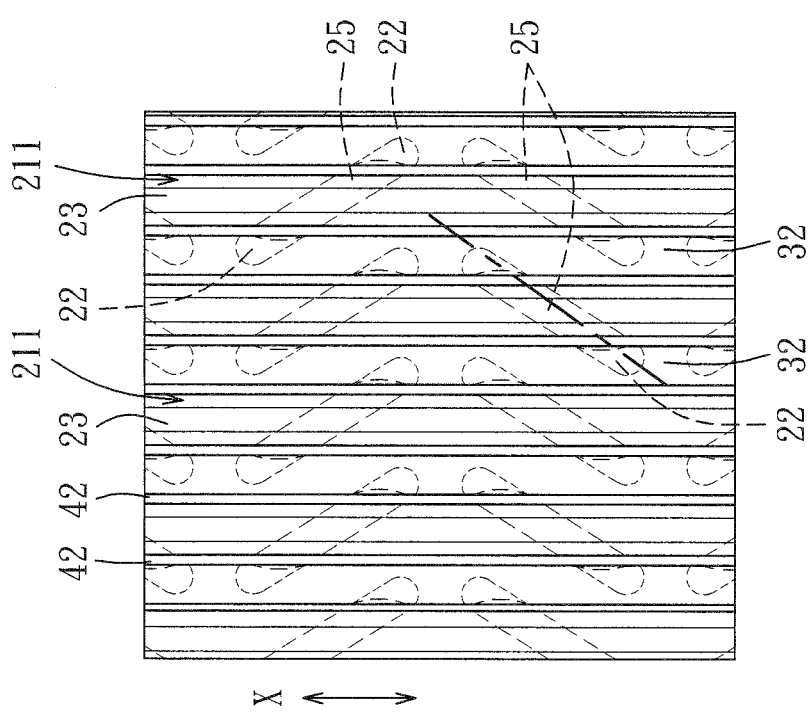
Figure 5P:
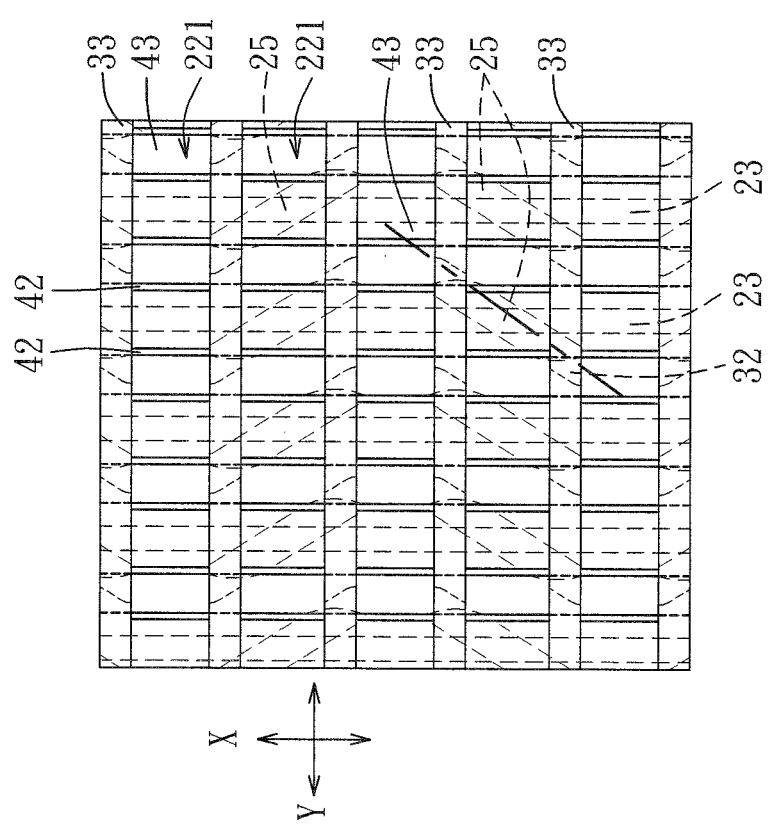
Figure 5Q:
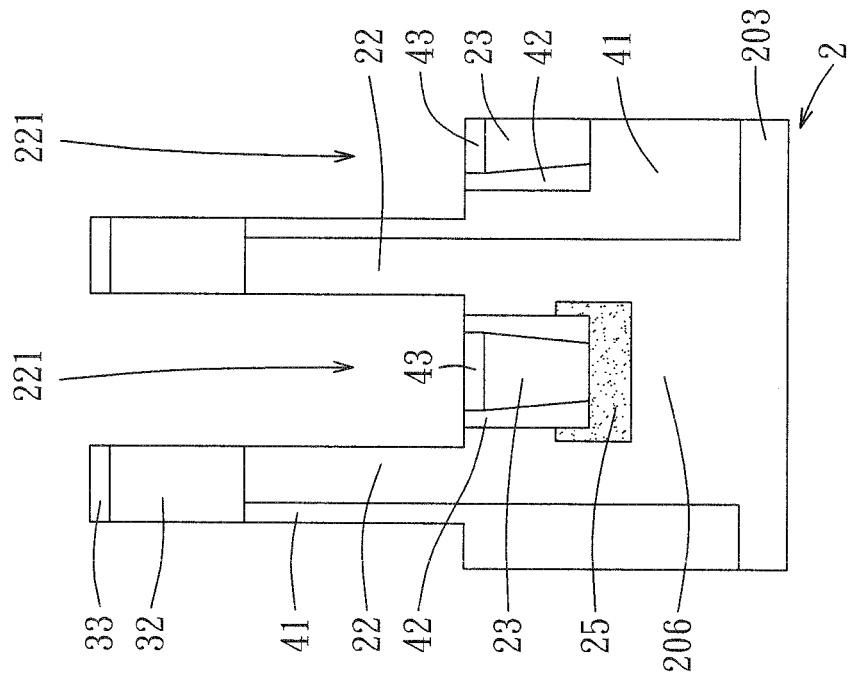
Figure 5R:
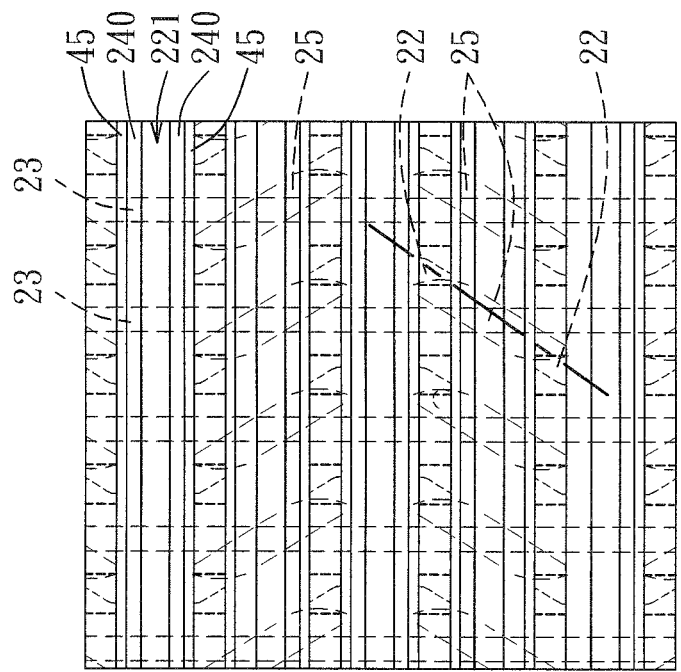
Figure 5S:
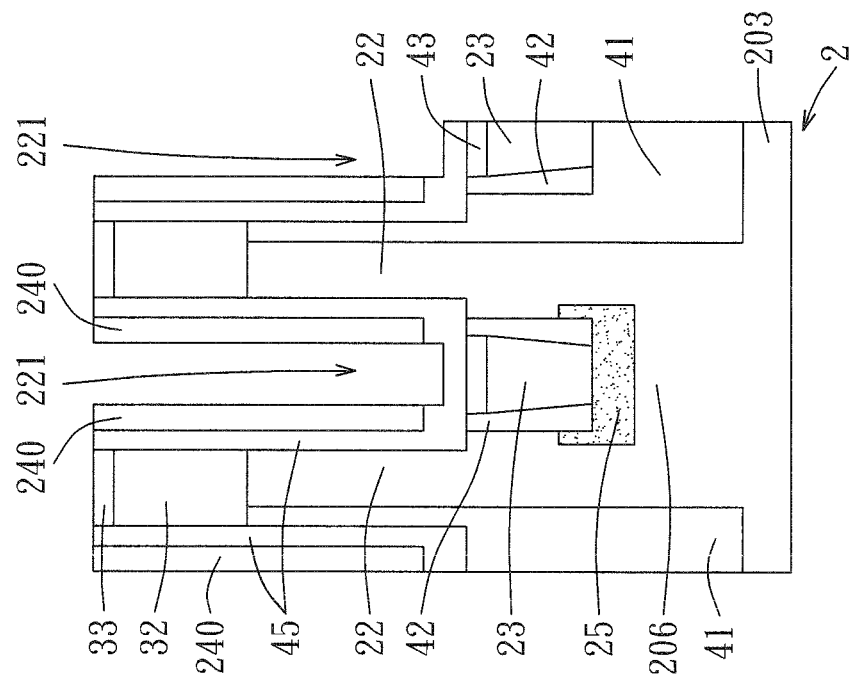
Figure 5U:
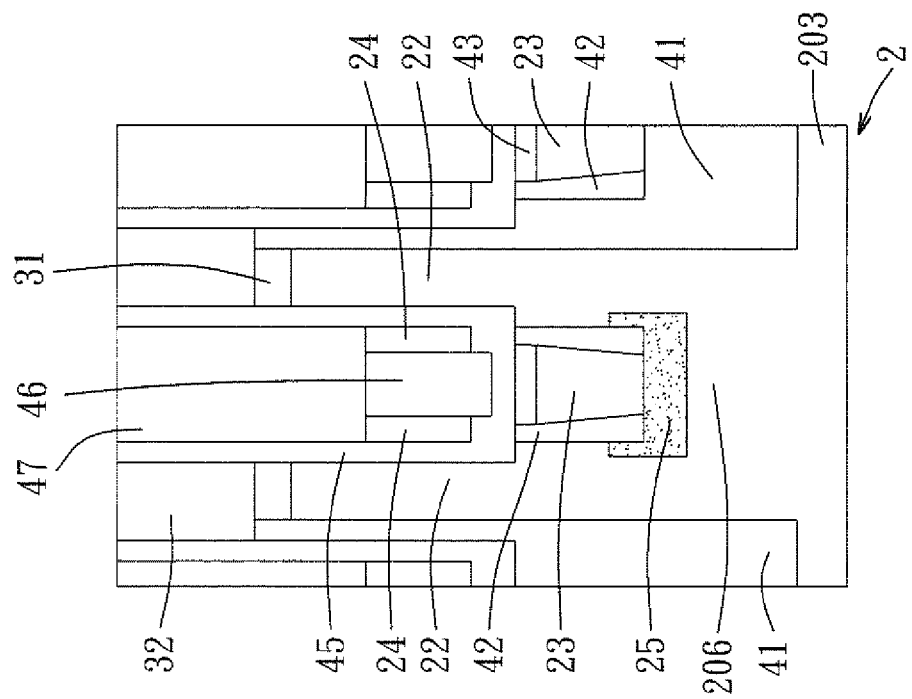
Figure 5T:
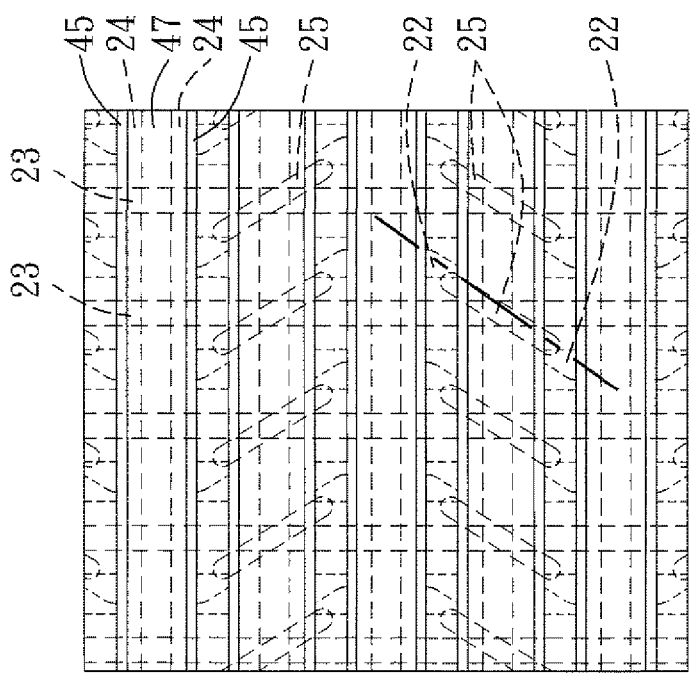
Figure 5W:
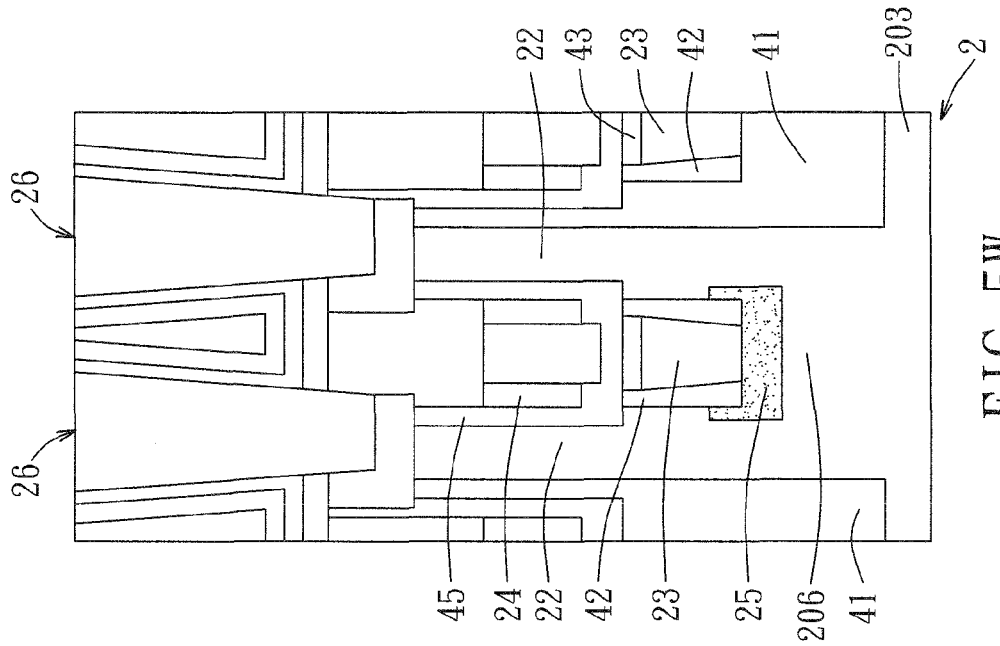
Figure 5V:
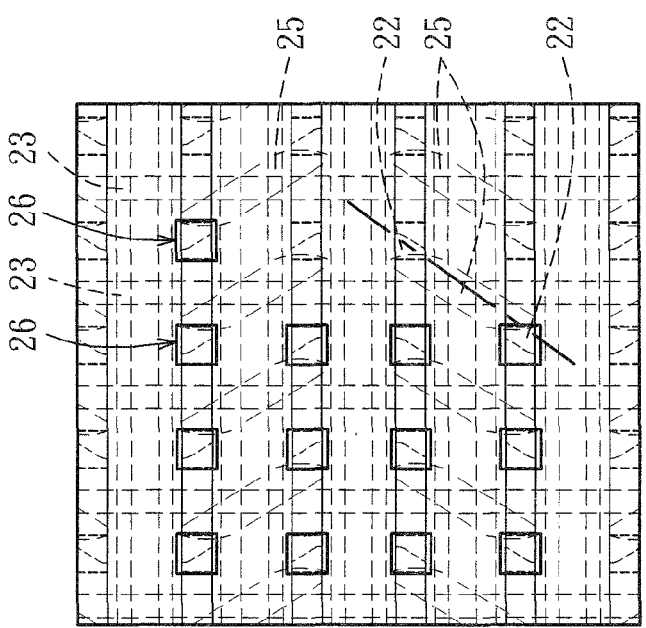

FIGS. 5A to 5W illustrate consecutive steps of a method of making the first preferred embodiment of the semiconductor device 100 according to the present invention. The method includes the steps of: providing a substrate 2 (see FIG. 5A); forming a first hard mask layer 31 on a top surface of the substrate 2 (see FIG. 5A); double patterning the first hard mask layer 31 by etching the first hard mask layer 31 along twisted paths 301 (each having a saw-like profile) and then along non-twisted paths (straight paths) 302 intersecting the twisted paths 301 (see FIG. 5A) so as to form a plurality of first troughs 306 and a plurality of second troughs 307 that cooperatively expose an exposure region of the top surface of the substrate 2 (see FIG. 5B); etching the substrate 2 from the exposure region of the top surface of the substrate 2 so as to form a plurality of twisted first grooves 201 and a plurality of parallel second grooves 202 in the substrate 2, the second grooves 202 intersecting the first grooves 201 so as to form the substrate 2 into a lower support 203 and a post array (see FIGS. 5C and 5D), the post array having a plurality of posts 205 that extend upwardly from the lower support 203 and that are arranged in rows and columns, the posts 205 of each of the columns of the post array being aligned along a column direction (X) in a twisted manner (each column of the post array having a shape similar to a saw-like dashed line); forming a first liner layer (not shown) on groove walls of the first and second grooves 201, 202; filling the first and second grooves 201, 202 in the substrate 2 with an isolation material 41 (see FIG. 5E); polishing a top portion of the isolation material 41 and removing the first hard mask layer 31 (not shown); forming a second hard mask layer 32 on the isolation material 41 (see FIG. 5F); patterning the second hard mask layer 32 by etching the second hard mask layer 32 along parallel bit line paths (not shown) extending along the column direction (X) so as to form a plurality of mask troughs 308 that cooperatively expose an exposure portion of the isolation material 41 and an exposure portion of each of the posts 205 (see FIGS. 5G and 5H); etching the posts 205 and the isolation material 41 from the exposure portion of the isolation material 41 and the exposure portion of each of the posts 205 so as to form a plurality of bit line trenches 211 (see FIGS. 5H to 5J), each of which extends in the column direction (X) through the posts 205 of a corresponding one of the columns of the post array such that each of the posts 205 is formed into a base part 206 and a pair of pillars 22 which extend upwardly from the base part 206 and which are separated by a corresponding one of the bit line trenches 211, the pillars 22 formed from the posts 205 of the post array cooperatively forming a pillar array and being arranged in rows and columns, each bit line trench 211 having a trench wall 212 that has a portion defined by corresponding ones of the pillars 22 and corresponding ones of the base parts 206 which are formed from the corresponding ones of the posts 205 through which the bit line trench 211 extends; forming a second liner layer 42 on the trench wall 212 of each of the bit line trenches 211 and etching back so as to expose each base part 206 (see FIG. 5K); ion implanting a dopant into each base part 206, followed by annealing for thermal diffusion of the dopant toward two adjacent ones of the pillars 22 so as to form a contact array including a plurality of bit line contacts 25 that are arranged in rows and columns (see FIGS. 5L and 5M), each of the bit line contacts 25 of each of the columns of the contact array being embedded in a respective one of the base parts 206 and extending between and being electrically connected to two adjacent ones of the pillars 22 that extend upwardly from the respective one of the base parts 206; depositing a metal-containing material in each of the bit line trenches 211 so as to form a plurality of bit lines 23 (see FIGS. 5N and 5O), each of which is disposed in and extends along a respective one of the bit line trenches 211 and each of which is electrically connected to and intersects the bit line contacts 25 of a respective one of the columns of the contact array, each of the bit lines 23 being formed on the second liner layer 42 so as to be insulated from the pillars 22 of two adjacent ones of the columns of the pillar array by the second liner layer 42; filling gaps in the bit line trenches 211 with a first gap filling material 43, followed by forming a third hard mask layer 33 on the second hard mask layer 32 and the first gap filling material 43 and then patterning the second and third hard mask layers 32, 33 by etching the second and third hard mask layers 32, 33 along parallel word line paths (not shown) extending along a row direction (Y) transverse to the column direction (X) so as to form a plurality of mask grooves (not shown) that expose two opposite end portions of each pillar 22 and a portion of the gap filling material 43; etching the pillars 22 and the first gap filling material 43 from the exposed end portions of each pillar 22 and the exposed portion of the first gap filling material 43 so as to form a plurality of word line trenches 221 (see FIGS. 5P and 5Q), each of which is disposed above and crosses the bit lines 23 and each of which extends in the row direction (Y) so as to expose two opposite sides of each of the pillars 22; forming a gate oxide layer 45 in each of the word line trenches 221 so that the gate oxide layer is formed on the sides of each of the pillars 22 (see FIGS. 5R and 5S); depositing a conductive material in each of the word line trenches 221, followed by etch back so as to form a plurality of conductive bands 240 (see FIGS. 5R and 5S), each of which extends along the row direction (Y), and each of which is formed on the gate oxide layer 45; depositing an insulative oxide material 46 in each of the word line trenches 221, followed by removing an upper portion of the oxide material 46 and an upper portion of each conductive band 240 by etching so as to form the conductive bands 240 into a plurality of word lines 24, respectively (see FIGS. 5T and 5U), each of which is electrically connected to the two opposite sides of each of the pillars 22 of a respective one of the rows of the pillar array; filling the word line trenches 221 with a second gap filling material 47, followed by forming a plurality of capacitors 26 (see FIGS. 5V and 5W), each of which is disposed on and is connected electrically to a respective one of the pillars 22. Since formation of the capacitors 26 can be conducted in a conventional manner, a detailed description of the same will be omitted herein for the sake of brevity.

Preferably, the first, second and third hardmask layers 31, 32, 33 are made from a material selected from SiN and $SiO_2$, or are formed by high density plasma (HDP) oxide deposition or by chemical vapor deposition using tetraethylorthosilicate (TEOS) as a precursor.

Preferably, the first liner layer and the second liner layer 42 are made from a material selected from SiN and $SiO_2$, or are formed by high density plasma (HDP) oxide deposition or by chemical vapor deposition using tetraethylorthosilicate (TEOS) as a precursor.

Preferably, the isolation material 41 is selected from SiN and $SiO_2$, or is formed by high density plasma (HDP) oxide deposition or by chemical vapor deposition using tetraethylorthosilicate (TEOS) as a precursor.

Preferably, the first and second gap filling materials 41, 43 are selected from SiN and $SiO_2$, or are formed by high density plasma (HDP) oxide deposition, or by chemical vapor deposition using tetraethylorthosilicate (TEOS) as a precursor, or by spin on dielectric (SOD) process.

Preferably, the word lines 24 are made from a conductive material selected from TiN, W, and Al.

By forming each bit line contact 25 extending between and connected to two adjacent pillars 22 that are respectively connected to two separated and adjacent word lines 24 and by forming each bit line made from the metal-containing material and intersecting the bit line contacts 25 of a respective column of the contact array according to the method of this invention, the aforesaid drawbacks associated with the prior art can be overcome.

While the present invention has been described in connection with what are considered the most practical and preferred embodiments, it is understood that this invention is not limited to the disclosed embodiments but is intended to cover various arrangements included within the spirit and scope of the broadest interpretation so as to encompass all such modifications and equivalent arrangements.

What is claimed is:

1. A semiconductor device comprising:
a substrate having a base and a pillar array, said pillar array including a plurality of pillars extending upwardly from said base and arranged in rows and columns, said pillars of each of said columns of said pillar array being disposed along a column direction;
a plurality of bit lines, each of which extends in the column direction and each of which is disposed between two adjacent ones of said columns of said pillar array;
a plurality of word lines, each of which extends in a row direction transverse to said column direction and each of which is electrically connected to a corresponding one of said rows of said pillar array; and
a contact array including a plurality of bit line contacts arranged in rows and columns, said bit line contacts of each of said columns of said contact array being disposed along the column direction, being embedded in said base, and being electrically connected to a respective one of said bit lines, each of said bit line contacts of each of said columns of said contact array intersecting the respective one of said bit lines and extending between and being electrically connected to two adjacent ones of said pillars.

2. The semiconductor device of claim 1, further comprising a plurality of capacitors disposed on and connected electrically to said pillars.

3. The semiconductor device of claim 1, wherein each of said bit line contacts of each of said columns of said contact array extends along a length direction between said two adjacent ones of said pillars, the length direction of each of said bit line contacts of each of said columns of said contact array crossing the length direction of an adjacent one of said bit line contacts of each of said columns of said contact array.

4. The semiconductor device of claim 1, wherein each of said bit line contacts of each of said columns of said contact array extends along a length direction between said two adjacent ones of said pillars, the length direction of each of said bit line contacts of each of said columns of said contact array being parallel to the length direction of an adjacent one of said bit line contacts of each of said columns of said contact array.

5. The semiconductor device of claim 1, wherein each of said bit lines is made from a conductive material containing a silicide of a refractory metal selected from one of titanium, tungsten, nickel and cobalt.

6. The semiconductor device of claim 1, wherein each of said bit line contacts contains implanted ions selected from As, P, and N type ions.

7. The semiconductor device of claim 1, wherein said substrate is a p-type or n-type silicon wafer.

* * * * *